(12) United States Patent
Darolia et al.

(10) Patent No.: US 6,663,983 B1
(45) Date of Patent: Dec. 16, 2003

(54) THERMAL BARRIER COATING WITH IMPROVED STRENGTH AND FRACTURE TOUGHNESS

(75) Inventors: Ramgopal Darolia, West Chester, OH (US); Joseph David Rigney, Milford, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/064,562

(22) Filed: Jul. 26, 2002

(51) Int. Cl.[7] .............................. B32B 15/04; F03B 3/12
(52) U.S. Cl. ..................... 428/632; 428/323; 428/469; 428/697; 428/699; 428/701; 428/702; 416/241 B
(58) Field of Search .................. 428/633, 323, 428/332, 338, 697, 699, 702, 621, 632, 655, 650, 701, 469; 416/241 B

(56) References Cited

U.S. PATENT DOCUMENTS

| 4,495,907 A | * | 1/1985 | Kamo |
| 4,738,227 A | | 4/1988 | Kamo et al. |
| 5,520,516 A | * | 5/1996 | Taylor et al. |
| 6,025,078 A | * | 2/2000 | Rickerby et al. |

OTHER PUBLICATIONS

Z. Ding et al., $Cr_2O_3$ *Particulate Reinforced Y–TZP Ceramics with High Fracture Toughness and Strength*, Science and Technology of Zirconia V (1993), p. 421–431.
U.S. patent application Ser. No. 09/710,682, Rigney et al., filed Nov. 9, 2000.

* cited by examiner

*Primary Examiner*—Deborah Jones
*Assistant Examiner*—Jennifer McNeil
(74) *Attorney, Agent, or Firm*—David L. Narciso; Gary M. Hartman; Domenica N. S. Hartman

(57) ABSTRACT

A thermal barrier coating (TBC) (26) for a component (10) intended for use in a hostile environment, such as the superalloy turbine, combustor and augmentor components of a gas turbine engine. The TBC (26) is formed of at least partially stabilized zirconia, preferably yttria-stabilized zirconia (YSZ), and exhibits improved strength and fracture toughness as a result of containing a dispersion of chromia precipitates or particles (32). The TBC (26) preferably consists essentially of YSZ and the chromia particles (32), which are preferably dispersed throughout the microstructure of the TBC (26), including the YSZ grains (30) and grain boundaries. The chromia particles (32) constitute at least 1 to about 10 volume percent of the TBC (26).

20 Claims, 1 Drawing Sheet

THERMAL BARRIER COATING WITH IMPROVED STRENGTH AND FRACTURE TOUGHNESS

BACKGROUND OF INVENTION

1. Field of the Invention

This invention relates to protective coatings for components exposed to high temperatures, such as the hostile thermal environment of a gas turbine engine. More particularly, this invention is directed to a thermal barrier coating (TBC) formed of a zirconia-based ceramic material that exhibits improved strength and fracture toughness as a result of containing a dispersion of chromia particles or precipitates.

2. Description of the Related Art

Components within the hot gas path of a gas turbine engine are often protected by a thermal barrier coating (TBC) system. TBC systems include a thermal-insulating ceramic topcoat, typically referred to as the TBC, typically bonded to the component with an environmentally-protective bond coat. Bond coat materials widely used in TBC systems include overlay coatings such as MCrAlX (where M is iron, cobalt and/or nickel, and X is yttrium or another rare earth or reactive element such as hafnium, zirconium, etc.), and diffusion coatings such as diffusion aluminides, notable examples of which are NiAl and NiAl (Pt). Ceramic materials and particularly binary yttria-stabilized zirconia (YSZ) are widely used as TBC materials because of their high temperature capability, low thermal conductivity, and relative ease of deposition by plasma spraying, flame spraying and physical vapor deposition (PVD) techniques.

TBC's employed in the highest temperature regions of gas turbine engines are often deposited by electron beam physical vapor deposition (EBPVD), which yields a columnar, strain-tolerant grain structure that is able to expand and contract without causing damaging stresses that lead to spallation of the TBC. Similar columnar microstructures can be produced using other atomic and molecular vapor processes, such as sputtering (e.g., high and low pressure, standard or collimated plume), ion plasma deposition, and all forms of melting and evaporation deposition processes (e.g., cathodic arc, laser melting, etc.). In contrast, plasma spraying techniques such as air plasma spraying (APS) deposit TBC material in the form of molten "splats," resulting in a TBC characterized by flat (noncolumnar) grains and a degree of inhomogeneity and porosity that reduces heat transfer through the TBC.

While YSZ TBC's are widely employed in the art for their desirable thermal and adhesion characteristics, they are susceptible to mechanical damage within the hot gas path of a gas turbine engine. For example, YSZ coatings are known to be susceptible to thinning from impact and erosion damage by hard particles in the high velocity gas path. Impact damage and the resulting loss of TBC particularly occur along the leading edges of components such as turbine blades, while erosion is more prevalent on the concave and convex surfaces of the blades, depending on the particular blade design. Both forms of mechanical damage not only shorten component life, but also lead to reduced engine performance and fuel efficiency. In U.S. Pat. No. 5,683,825 to Bruce et al., an erosion-resistant TBC is disclosed in which alumina ($Al_2O_3$) or silicon carbide (SiC) is deposited as a protective coating on a TBC, or co-deposited with the TBC. Commonly-assigned U.S. patent application Ser. No. 09/710,682 to Rigney et al. discloses a TBC comprising alternating layers of YSZ and YSZ containing at least five volume percent of alumina and/or chromia ($Cr_2O_3$) particles to increase the impact and wear resistance of the TBC.

In order for a TBC to remain effective throughout the planned life cycle of the component it protects, it must also maintain a low thermal conductivity throughout the life of the component. However, the thermal conductivity of YSZ has been observed to increase by 30% or more over time when subjected to the operating environment of a gas turbine engine. This increase has been associated with coarsening of the zirconia-based microstructure through grain and pore growth and grain boundary creep. As a solution, U.S. patent application Ser. No. 09/765,228 to Rigney et al. discloses a TBC formed to contain small amounts of alumina precipitates dispersed throughout the grain boundaries and pores of the TBC. These alumina precipitates getter oxide impurities that would otherwise allow or promote grain sintering and coarsening and pore coarsening, the consequence of which would be densification of the TBC and increased thermal conductivity. Another solution proposed in commonly-assigned U.S. patent application Ser. No. 09/833,446 to Rigney et al. is to modify a YSZ TBC to contain one or more additional metal oxides that increase crystallographic defects and lattice strains in the TBC grains and/or form precipitates of zirconia and/or compound(s) of zirconia and/or yttria and the additional metal oxide(s), all of which are disclosed as reducing the thermal conductivity of YSZ. Metal oxides disclosed as having this beneficial effect are the alkaline-earth metal oxides magnesia (MgO), calcia (CaO), strontia (SrO) and barium oxide (BaO), the rare-earth metal oxides lanthana ($La_2O_3$), ceria ($CeO_2$), neodymia ($Nd_2O_3$), gadolinium oxide ($Gd_2O_3$) and dysprosia ($Dy_2O_3$), as well as such metal oxides as nickel oxide (NiO), ferric oxide ($Fe_2O_3$), cobaltous oxide (CoO), and scandium oxide ($Sc_2O_3$).

In addition to compositional modifications such as those noted above, processing modifications are also being considered in order to reduce the thermal conductivity of YSZ. However, lower thermal conductivities correspond to a much higher thermal gradient through the thickness of a TBC, creating much higher stresses within the TBC due to the mismatch in coefficients of thermal expansion (CTE) between the ceramic TBC and the underlying metallic substrate and bond coat. It is possible that such stresses can exceed the fracture strength of a YSZ TBC. As such, TBC=s that exhibit improved strength and fracture toughness would be desirable for more demanding engine designs.

SUMMARY OF INVENTION

The present invention generally provides a thermal barrier coating (TBC) for a component intended for use in a hostile environment, such as the superalloy turbine, combustor and augmentor components of a gas turbine engine. The TBC of this invention exhibits improved strength and fracture toughness as a result of containing a dispersion of fine chromia particles or precipitates (hereinafter referred to simply as particles) within its porous microstructure. The TBC preferably consists essentially of yttria-stabilized zirconia and the chromia particles, which are dispersed throughout the microstructure of the TBC including the YSZ grains and grain boundaries. Importantly, the chromia particles are present in an amount sufficient to increase the strength and fracture toughness of the TBC, generally at least one volume percent up to about ten volume percent of the TBC. The resulting improved strength and fracture toughness of the TBC increases its ability to withstand high thermally-induced stresses that occur as a result of large thermal gradients through the TBC thickness.

In the form of discrete particles in the above-noted amounts, sufficient chromia is present to increase the strength and fracture toughness through dispersion hardening of the TBC material, while avoiding the presence of localized compositional gradients that would decrease the spallation resistance of the TBC. The dispersion of chromia particles serves to increase the strength and fracture toughness of YSZ, and therefore the entire TBC, more effectively than a discrete layer of chromia at the TBC surface. The presence of a uniform dispersion of chromia particles is also distinguishable from U.S. patent application Ser. No. 09/710,682 to Rigney et al., which discloses a TBC comprising alternating layers of YSZ and YSZ containing alumina and/or chromia particles. When present as a dispersion throughout the TBC (as opposed to layers), the chromia particles provide a uniform improvement in strength and fracture toughness throughout the life of the TBC.

Other objects and advantages of this invention will be better appreciated from the following detailed description.

DETAILED DESCRIPTION

Figure 1:
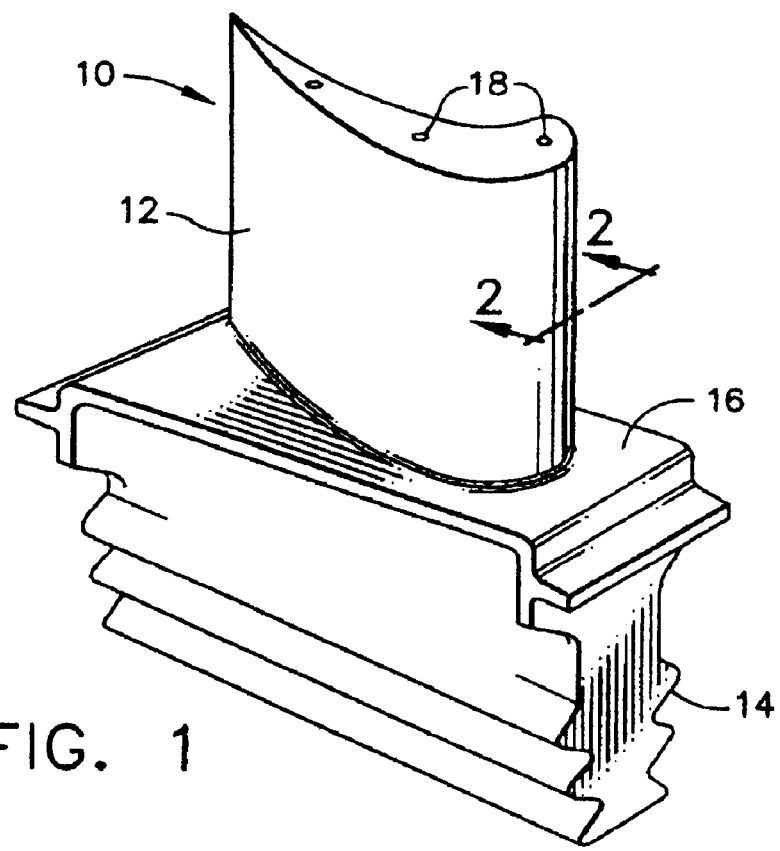
FIG. 1 is a perspective view of a high pressure turbine blade.

The present invention is generally applicable to components subjected to high temperatures, and particularly to components such as the high and low pressure turbine nozzles and blades, shrouds, combustor liners and augmentor hardware of gas turbine engines. An example of a high pressure turbine blade 10 is shown in FIG. 1. The blade 10 generally includes an airfoil 12 against which hot combustion gases are directed during operation of the gas turbine engine, and whose surface is therefore subjected to hot combustion gases as well as attack by oxidation, corrosion and erosion. The airfoil 12 is protected from its hostile operating environment by a thermal barrier coating (TBC) system 20 schematically depicted in FIG. 2. The airfoil 12 is anchored to a turbine disk (not shown) with a dovetail 14 formed on a root section 16 of the blade 10. Cooling passages 18 are present in the airfoil 12 through which bleed air is forced to transfer heat from the blade 10. While the advantages of this invention will be described with reference to the high pressure turbine blade 10 shown in FIG. 1, the teachings of this invention are generally applicable to any component on which a thermal barrier coating may be used to protect the component from a high temperature environment.

Figure 2:
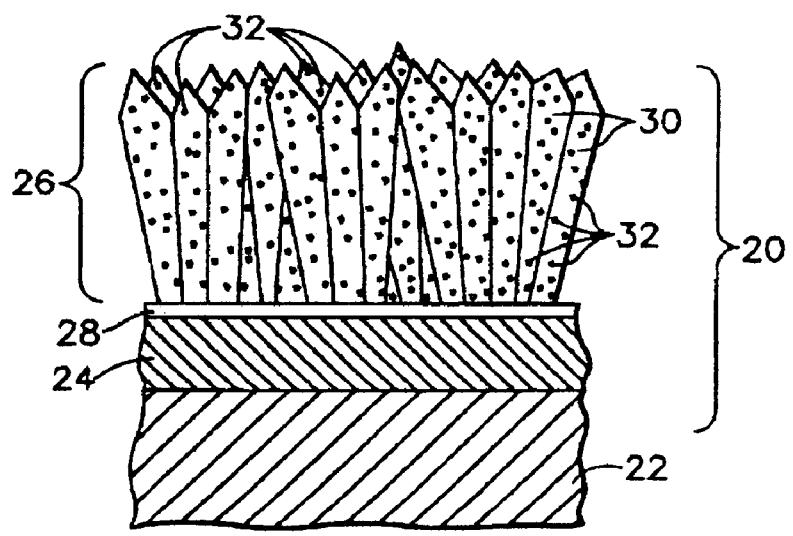
FIG. 2 is a cross-sectional view of the blade of FIG. 1 along line 2—2, and shows a thermal barrier coating system on the blade in accordance with this invention.

The TBC system 20 is represented in FIG. 2 as including a metallic bond coat 24 that overlies the surface of a substrate 22, the latter of which is typically a superalloy and the base material of the blade 10. As is typical with TBC systems for components of gas turbine engines, the bond coat 24 is an aluminum-rich composition, such as an overlay coating of an MCrAlX alloy or a diffusion coating such as a diffusion aluminide or a diffusion platinum aluminide of a type known in the art. Aluminum-rich bond coats of this type develop an aluminum oxide (alumina) scale 28, which is grown by oxidation of the bond coat 24. The alumina scale 28 chemically bonds a thermal-insulating ceramic layer, or TBC 26, to the bond coat 24 and substrate 22. The TBC 26 of FIG. 2 is represented as having a strain-tolerant microstructure of columnar grains 30. As known in the art, such columnar microstructures can be achieved by depositing the TBC 26 using a physical vapor deposition technique, such as EBPVD. While the following discussion will focus on columnar TBC of the type shown in FIG. 2, the invention is also applicable to noncolumnar TBC deposited by such methods as plasma spraying, including air plasma spraying (APS). The microstructure of this type of TBC is characterized by splat-shaped (i.e., irregular and flattened) grains and a degree of inhomogeneity and porosity.

The present invention is particularly directed to yttria-stabilized zirconia (YSZ) as the material for the TBC 26. A suitable composition for the YSZ is about 2 to about 20 weight percent yttria, more preferably about 3 to about 8 weight percent yttria. However, the invention is believed to be generally applicable to zirconia-based TBC, which encompasses zirconia partially or fully stabilized by magnesia, ceria, calcia, scandia or other oxides. YSZ modified with additional oxides to reduce thermal conductivity are also within the scope of this invention. The TBC 26 is deposited to a thickness that is sufficient to provide the required thermal protection for the underlying substrate 22 and blade 10, generally on the order of about 75 to about 300 micrometers.

As a result of the process by which the TBC 26 is deposited, the individual grains 30 of the TBC 26 are characterized by a uniform dispersion of chromia particles and/or precipitates 32 (hereinafter, particles) within the grains 30 and at and between the grain boundaries. According to the invention, the chromia particles 32 dispersion harden the porous YSZ microstructure, which is believed to promote the overall strength and fracture toughness of the TBC 26 if present in sufficient amounts in the form of a fine limited dispersion within the TBC 26, without discrete and homogeneous layers of chromia. Improved strength and fracture toughness of the TBC 26 increases the capability of the TBC 26 to withstand high thermally-induced stresses that occur as a result of large thermal gradients through the thickness of the TBC 26. These benefits should persist throughout the life of the blade 10 as a result of the chromia particles 32 being insoluble in YSZ, and therefore remaining thermodynamically stable with YSZ at elevated temperatures to which the TBC 26 will be subjected within the environment of a gas turbine engine.

The chromia particles 32 are preferably present in an amount of at least one volume percent of the TBC 26 in order to contribute to the strength and fracture toughness of the TBC 26. A suitable upper limit is about ten volume percent, more preferably about five volume percent, so as not to compromise other desirable properties such as spallation resistance and thermal conductivity. In a preferred embodiment, the chromia particles 32 are present in a range of about one up to three volume percent of the TBC 26. Within this range, it is believed that strength and fracture toughness is significantly improved through precipitation hardening, with minimal effect on processing, spallation resistance and thermal conductivity of the coating material. The particles 32 preferably have diameters on the order of about 0.001 to about 1 micrometer, more preferably about 0.01 to about 0.1 micrometer to promote the strength and fracture toughness of the TBC 26. Larger chromia particles 32 in the TBC 26 are believed to be undesirable as being significantly less effective at strengthening the TBC 26.

A suitable process for depositing the columnar TBC 26 of FIG. 2 is a physical vapor deposition process, alone or assisted by chemical vapor deposition (CVD). A preferred process is believed to be EBPVD, which generally entails loading a component (such as the blade 10 of FIG. 1) to be coated into a coating chamber, evacuating the chamber, and then backfilling the chamber with oxygen and an inert gas such as argon to achieve a subatmospheric chamber pressure. The component is then supported in proximity to one or more ingots of the desired coating material, and one or more electron beams are projected onto the ingot(s) so as to evaporate the ingots and produce a vapor that deposits (condenses) on the component surface. While similar in many respects to conventional EBPVD, the process for depositing the columnar TBC 26 of this invention requires that sources of yttria, zirconia and chromia are present within one or more ingots. For example, the TBC 26 can be deposited by simultaneously evaporating separate ingots of YSZ and chromia. Alternatively, a single ingot containing YSZ and chromia regions or a dispersion of chromia can be evaporated to produce the TBC 26. Another alternative is to evaporate an ingot of YSZ and a separate ingot that contains chromium metal, the latter of which when evaporated produces chromium vapors that oxidize in the presence of oxygen and result in the deposition of chromia vapors along with YSZ.

Other process variables or fixturing, such as rotation and masking of a component, can be used to selectively deposit the TBC 26 of this invention on particular surface regions of the component that are relatively more prone to damage, such as the leading edge of the blade 10 in FIG. 1. In any event, deposition is carried out so that chromia condenses to form the discrete and fine particles 32 represented in FIG. 2. Because chromia is not soluble in YSZ, the particles 32 remain as discrete particles that will not alloy with YSZ within the TBC 26. The TBC 26 is not fully dense, but instead has a porous microstructure with the fine chromia particles 32 dispersed within the TBC grains 30 and at the grain boundaries to provide dispersion hardening of the YSZ.

While the invention has been described in terms of a preferred embodiment, it is apparent that other forms could be adopted by one skilled in the art. Accordingly, the scope of the invention is to be limited only by the following claims.

What is claimed is:

1. A component having a thermal barrier coating on a surface thereof, the thermal barrier coating consisting essentially of at least partially stabilized zirconia and a dispersion of chromia particles with diameters of not larger than one micrometer, the thermal barrier coating having a microstructure comprising grains and grain boundaries, the chromia particles being located within the grains and at the grain boundaries in an amount sufficient to increase the strength and fracture toughness of the thermal barrier coating.

2. A component according to claim 1, wherein the chromia particles constitute about 1 up to about 10 volume percent of the thermal barrier coating.

3. A component according to claim 1, wherein the chromia particles constitute about 1 to about 3 volume percent of the thermal barrier coating.

4. A component according to claim 1, wherein the chromia particles are not present in discrete and homogeneous layers within the thermal barrier coating.

5. A component according to claim 1, wherein the chromia particles are about 0.01 to about 0.1 micrometer in diameter.

6. A component according to claim 1, wherein the grains of the thermal barrier coating are columnar so that the microstructure is columnar.

7. A component according to claim 1, wherein the zirconia is at least partially stabilized by about 2 to about 20 weight percent yttria.

8. A component according to claim 1, wherein the zirconia is partially stabilized by 3 to 8 weight percent yttria.

9. A component according to claim 1, wherein the thermal barrier coating consists of the at least partially stabilized zirconia and about 1 to about 10 volume percent chromia particles.

10. A component according to claim 1, wherein the component is a blade of a gas turbine engine, and the thermal barrier coating is deposited on a leading edge of the blade.

11. A gas turbine engine component comprising:
   a superalloy substrate;
   a metallic bond coat on a surface of the substrate; and
   a thermal barrier coating on the bond coat, the thermal barrier coating consisting essentially of yttria-stabilized zirconia and about 1 to about 5 volume percent chromia particles, the thermal barrier coating having a microstructure comprising grains and grain boundaries, the chromia particles being dispersed within the grains and at the grain boundaries to increase the strength and fracture toughness of the thermal barrier coating.

12. A gas turbine engine component according to claim 11, wherein the chromia particles constitute about 1 up to about 3 volume percent of the thermal barrier coating.

13. A gas turbine engine component according to claim 11, wherein the chromia particles are not larger than about one micrometer in diameter.

14. A gas turbine engine component according to claim 11, wherein the chromia particles are about 0.01 to about 0.1 micrometer in diameter.

15. A gas turbine engine component according to claim 11, wherein the grains of the thermal barrier coating are columnar so that the microstructure is columnar.

16. A gas turbine engine component according to claim 11, wherein the yttria-stabilized zirconia contains about 2 to about 20 weight percent yttria.

17. A gas turbine engine component according to claim 11, wherein the yttria-stabilized zirconia contains 3 to 8 weight percent yttria.

18. A gas turbine engine component according to claim 11, wherein the thermal barrier coating consists of yttria-stabilized zirconia and about 1 to about 3 volume percent chromia particles.

19. A gas turbine engine component according to claim 11, wherein the component is a turbine blade and the thermal barrier coating is deposited on a leading edge of the blade.

20. A gas turbine engine component comprising:
   a superalloy substrate;
   a metallic bond coat on a surface of the substrate; and
   a thermal barrier coating on the bond coat, the thermal barrier coating consisting of 1 to 3 volume percent chromia particles dispersed in zirconia stabilized by 3 to 8 weight percent yttria, the thermal barrier coating having a microstructure comprising grains and grain boundaries, the chromia particles having diameters in a range of about 0.01 to about 0.1 micrometer and being dispersed within the grains and at the grain boundaries to increase the strength and fracture toughness of the thermal barrier coating.

* * * * *